(12) United States Patent
Kim et al.

(10) Patent No.: US 12,422,496 B2
(45) Date of Patent: Sep. 23, 2025

(54) SECONDARY BATTERY LIFE EVALUATION DEVICE AND METHOD THEREOF

(71) Applicant: SAMSUNG SDI CO., LTD., Yongin-si (KR)

(72) Inventors: Yong Chan Kim, Yongin-si (KR); Hye Won Kim, Yongin-si (KR); Seon Hye Yoon, Yongin-si (KR); Su Jin Park, Yongin-si (KR); Seon Yeong Lee, Yongin-si (KR); Hack Jun Lee, Yongin-si (KR); Chan Yeong Kim, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 162 days.

(21) Appl. No.: 18/381,328

(22) Filed: Oct. 18, 2023

(65) Prior Publication Data
US 2024/0210487 A1    Jun. 27, 2024

(30) Foreign Application Priority Data
Dec. 27, 2022 (KR) .......... 10-2022-0185658

(51) Int. Cl.
*G01R 31/392* (2019.01)
*G01R 31/367* (2019.01)
*G01R 31/389* (2019.01)

(52) U.S. Cl.
CPC ......... *G01R 31/392* (2019.01); *G01R 31/367* (2019.01); *G01R 31/389* (2019.01)

(58) Field of Classification Search
None
See application file for complete search history.

(56) References Cited

U.S. PATENT DOCUMENTS 9,360,531 B2    6/2016   Suh et al.
10,564,224 B2   2/2020   Kwon et al.
(Continued)

FOREIGN PATENT DOCUMENTS

| CN | 112858941 A | 5/2021 |
| KR | 10-1549906 B1 | 9/2015 |

(Continued)

OTHER PUBLICATIONS

Jung Tai-Jong, et al., "Statistical and computational analysis for state-of-health and heat generation behavior of long-term cycled LiNi0.8Co0.15A10.0502/Graphite cylindrical lithium-ion cells for energy storage applications", Journal of Power Sources, vol. 529 (2022).

(Continued)

*Primary Examiner* — Jas A Sanghera
(74) *Attorney, Agent, or Firm* — Lee IP Law, P.C.

(57) ABSTRACT

A method for evaluating a life of a secondary battery, including an evaluation condition input process of inputting a temperature, a charging rate, and a discharging rate to evaluate the life of the secondary battery, a data computation process of computing an evaluation period, in which a state of health of the secondary battery reaches a set range, a capacity degradation rate, and a direct current internal resistance change rate, and an acceleration factor calculation process of calculating an acceleration factor of the secondary battery using a first equation, the first equation being that the acceleration factor is equal to the direct current internal resistance increase rate divided by the capacity degradation rate.

20 Claims, 3 Drawing Sheets

(56) References Cited

U.S. PATENT DOCUMENTS

2013/0297244 A1   11/2013  Takatsuji
2023/0022353 A1*  1/2023   Ryu .................... G01R 31/367

FOREIGN PATENT DOCUMENTS

KR   10-1927538  B1   12/2018
KR   10-2010989  B1   8/2019

OTHER PUBLICATIONS

European Search Report dated May 24, 2024, of the corresponding European Patent Application No. 23216412.9.

* cited by examiner

| | Temp | Crate(CH) | Crate(DH) | SOC swing | Evaluation period@SOH85% |
|---|---|---|---|---|---|
| Comparative Example 1 | 25 °C | 0.5 | 0.2 | 0-100%* | 300D |
| Comparative Example 2 | 25 °C | 0.5 | 0.5 | 0-100%* | 230D |
| Embodiment 1 | 25 °C | 0.5 | 1 | 0-100%* | 200D |
| Embodiment 2 | 25 °C | 0.5 | 2 | 0-100%* | 130D |

SECONDARY BATTERY LIFE EVALUATION DEVICE AND METHOD THEREOF

CROSS-REFERENCE TO RELATED APPLICATION

Korean Patent Application No. 10-2022-0185658 filed on Dec. 27, 2022, in the Korean Intellectual Property Office, is herein incorporated by reference in its entirety.

BACKGROUND

1. Field

Embodiments relate to a device and method for evaluating a life of a secondary battery.

2. Description of the Related Art

Lithium-ion secondary batteries have proliferated primarily in small-sized batteries used in information technology (IT) devices such as mobile phones and laptops. Recently, greater focus has been made on long life, high output, and safety due to the characteristics and needs in large-capacity application fields as demand for large-capacity secondary batteries continues to increase due to their expanding application and use for medium/large-sized power storage such as electric vehicles and energy storage systems (ESSs).

SUMMARY

Embodiments are directed to a method for evaluating a life of a secondary battery, including an evaluation condition input process of inputting a temperature, a charging rate, and a discharging rate to evaluate the life of the secondary battery a data computation process of computing an evaluation period, in which a state of health of the secondary battery reaches a set range, a capacity degradation rate, and a direct current internal resistance change rate, and an acceleration factor calculation process of calculating an acceleration factor of the secondary battery using a first equation, the first equation being that the acceleration factor is equal to a direct current internal resistance increase rate divided by the capacity degradation rate.

In the data computation process, the set range of the state of health of the secondary battery may be about 80% to about 90%.

In the acceleration factor calculation process, the acceleration factor may be about 3 to about 8.

In the evaluation condition input process, the temperature may be input as a constant value, and at least one of a charge rate or a discharge rate is input as a variable value.

In the evaluation condition input process, the temperature and the charging rate may be input as constant values, and a discharge rate may be input as a variable value.

In the evaluation condition input process, the discharge rate may be input at a value higher than that of the charging rate.

Embodiments are directed to a device for evaluating a life of a secondary battery, including an input unit receiving a temperature, a charging rate, and a discharging rate to evaluate the life of the secondary battery, a data computation unit computing an evaluation period, in which a state of health of the secondary battery reaches a set range, a capacity degradation rate, and a direct current internal resistance change rate, and an acceleration factor calculation unit calculating an acceleration factor of the secondary battery using a first equation, the first equation being that the acceleration factor is equal to a direct current internal resistance increase rate divided by the capacity degradation rate.

In the data computation unit, the set range of the state of health of the secondary battery may be about 80% to about 90%.

In the acceleration factor calculation unit, the acceleration factor may be about 3 to about 8.

In the evaluation condition input unit, the temperature may be input as a constant value, and at least one of a charge rate or a discharge rate may be input as a variable value.

In the evaluation condition input unit, the temperature and the charging rate may be input as constant values, and a discharge rate may be input as a variable value.

In the evaluation condition input unit, the discharge rate may be input at a value higher than that of the charging rate.

Embodiments are directed to a method for evaluating a life of a secondary battery, including an evaluation condition input process of inputting a temperature, a charging rate, and a discharging rate to evaluate the life of the secondary battery, a data computation process of computing an evaluation period, in which a state of health of the secondary battery reaches a set range, a capacity degradation rate, and a direct current internal resistance change rate, and an acceleration factor calculation process of calculating an acceleration factor of the secondary battery using a first equation.

In the data computation process, the set range of the state of health of the secondary battery may be about 80% to about 90%.

In the acceleration factor calculation process, the acceleration factor may be about 3 to about 8.

In the evaluation condition input process, the temperature may be input as a constant value, and at least one of a charge rate or a discharge rate may be input as a variable value.

In the evaluation condition input process, the temperature and the charging rate may be input as constant values, and a discharge rate may be input as a variable value.

In the evaluation condition input process, the discharge rate may be input at a value higher than that of the charging rate.

The discharge rate may be about 0.5 C to about 2.5 C.

The first equation may be that the acceleration factor is equal to a direct current internal resistance increase rate divided by the capacity degradation rate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
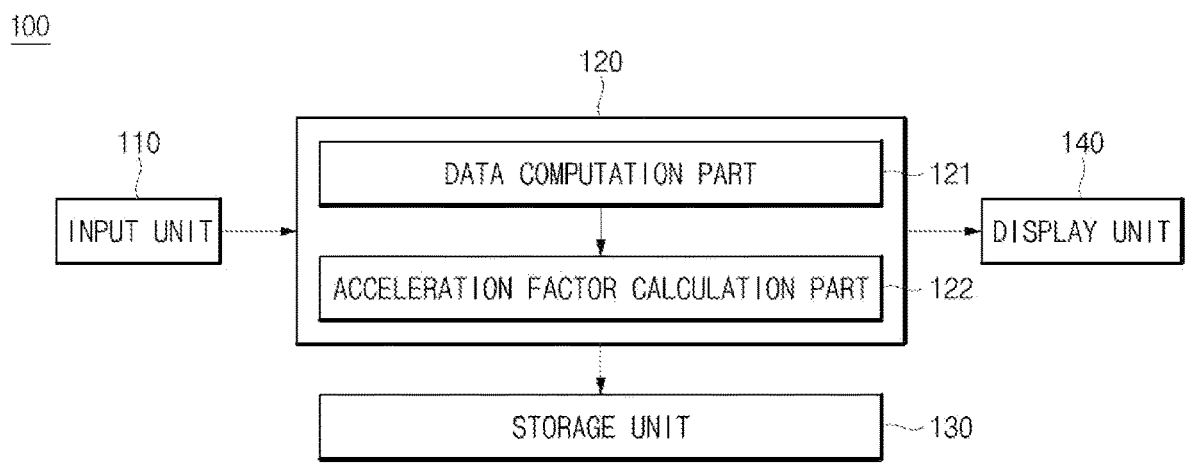
FIG. 1 is a block diagram showing a device including an input unit, a data processing unit, a storage unit, and a display unit, for evaluating a life of a secondary battery according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that if a layer or element is referred to as being "on" another layer or substrate, it can be directly on the other layer or substrate, or intervening layers may also be present. Further, it will be understood that if a layer is referred to as being "under" another layer, it can be directly under, and one or more intervening layers may also be present. In addition, it will also be understood that if a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. The terms used in this specification are for illustrative purposes of the present disclosure only and should not be construed to limit the meaning or the scope of the present disclosure. As used in this specification, a singular form may, unless definitely indicating a particular case in terms of the context, include a plural form. Also, the expressions "comprise" and/or "comprising" used in this specification neither define the mentioned shapes, numbers, processes, operations, members, elements, and/or groups of these, nor exclude the presence or addition of one or more other different shapes, numbers, processes, operations, members, elements, and/or groups of these, or addition of these. The term "and/or" used herein includes any and all combinations of one or more of the associated listed items.

In addition, a device for evaluating a life and/or other related devices or components according to the present disclosure may be implemented using any suitable hardware, firmware (e.g., application-specific semiconductor), software, or a suitable combination of software, firmware, and hardware. For example, various components of a device for evaluating a life and/or other related devices or parts according to the present disclosure may be formed on one integrated circuit chip or a separate integrated circuit chip. In some embodiments, various components of the device for evaluating the life may be implemented on a flexible printed circuit film and may be formed on a tape carrier package, a printed circuit board, or a substrate that is the same as the device for evaluating a life. In some embodiments, various components of the device for evaluating the life may be processors or threads, which are executed in one or more processors, in one or more computing devices, and it may execute computer program instructions and interact with other components to perform various functions discussed below. The computer program instructions may be stored in memory that is capable of being executed in the computing device using standard memory device such as, for example, random access memory. The computer program instructions may also be stored in other non-transitory computer readable media such as, for example, a CD-ROM, flash drive or the like. In some embodiments, those skilled in the art related to the present disclosure should be recognized that the functions of various computing devices are combined with each other or incorporated into one computing device, or the functions of a particular computing device are dispersed in one or more other computing devices without departing from the exemplary embodiments of the present disclosure.

For example, the device for evaluating the life according to the present disclosure may operate on a normal commercial computer constituted by a central processing unit, a mass storage device such as a hard disk or a solid-state disk, a volatile memory device, an input device such as a keyboard or a mouse, and an output device such as a monitor or a printer.

A secondary battery manufactured according to various and complicated design factors may be evaluated for life according to a typical method for evaluating a life or a method for evaluating a life according to the present disclosure. In some embodiments, the method for evaluating the life may mean a method for measuring an evaluation period to reach a limit SOH (state of health) by degrading the secondary battery under typical evaluation conditions. In general, because a typical method for evaluating a life, which requires a long time in proportion to the life of the product (secondary battery), it may be difficult to obtain results in a short time.

In some embodiments, in the method for evaluating the life according to the present disclosure, a temperature, a charging rate and/or a discharging rate, which are set in the typical method for evaluating the life, may be changed to reduce the life evaluation period compared to the typical life evaluation period.

FIG. 1 is a block diagram showing a device including an input unit, a data processing unit, a storage unit, and a display unit, for evaluating a life of a secondary battery according to example embodiments. Referring to FIG. 1, a device 100 for evaluating a life according to embodiments of the present disclosure may include an input unit 110, a data processing unit 120, a storage unit 130, and a display unit 140. In some embodiments, the device 100 for evaluating the life may be implemented by a personal computer, a server computer, or an equivalent thereof.

Evaluation conditions for evaluating the life of the secondary battery may be input into the input unit 110. In some embodiments, data such as a temperature, a charging rate, and a discharging rate for accelerating the life evaluation period may be input into the input unit 110. Such the data may be automatically input from an experiment, measurement or evaluation device or may be manually input by a keyboard or a mouse.

The data processing unit 120 may include a data computation part 121 and an acceleration factor calculation part 122. In some embodiments, the data processing unit 120 may be implemented by program, software, or an equivalent thereof, which may be installed in a computer.

The data computation part 121 may compute a capacity degradation rate, a DC-IR change rate and an evaluation period of the secondary battery.

The acceleration factor calculation part 122 may calculate an acceleration factor (A.F) according to the capacity degradation rate and the DC-IR change rate, which may be calculated by the data computation part 121.

The storage unit 130 may store various data of the input unit 110 and the data processing unit 120. In some embodiments, the storage unit 130 may store not only evaluation conditions input into the input unit 110, but also the capacity degradation rate, the DC-IR change rate, the evaluation period, and the acceleration factor. The storage unit 130 may be a normal hard disk, flash memory, CD ROM, or an equivalent thereof.

The display unit 140 may display various data of the input unit 110 and the data processing unit 120. In some embodiments, the display unit 140 may display not only the evaluation conditions input into the input unit 110, but also the capacity degradation rate, the DC-IR change rate, and the acceleration factor. This display unit 140 may be a normal LCD monitor or an equivalent thereof.

An operation of the device 100 for evaluating the life will be described in more detail through a method for evaluating the life, which will be described below.

Figure 2:
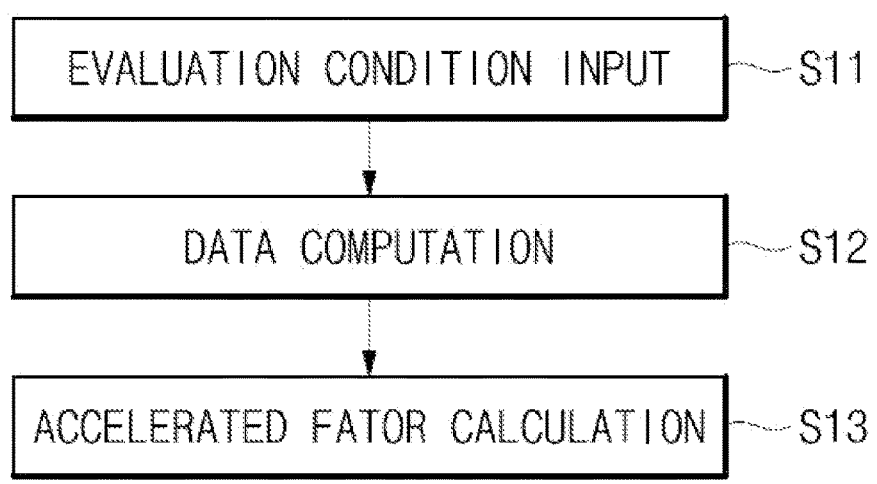
FIG. 2 is a block diagram showing a method for evaluating a life according to example embodiments.
Figures 3, 4A:
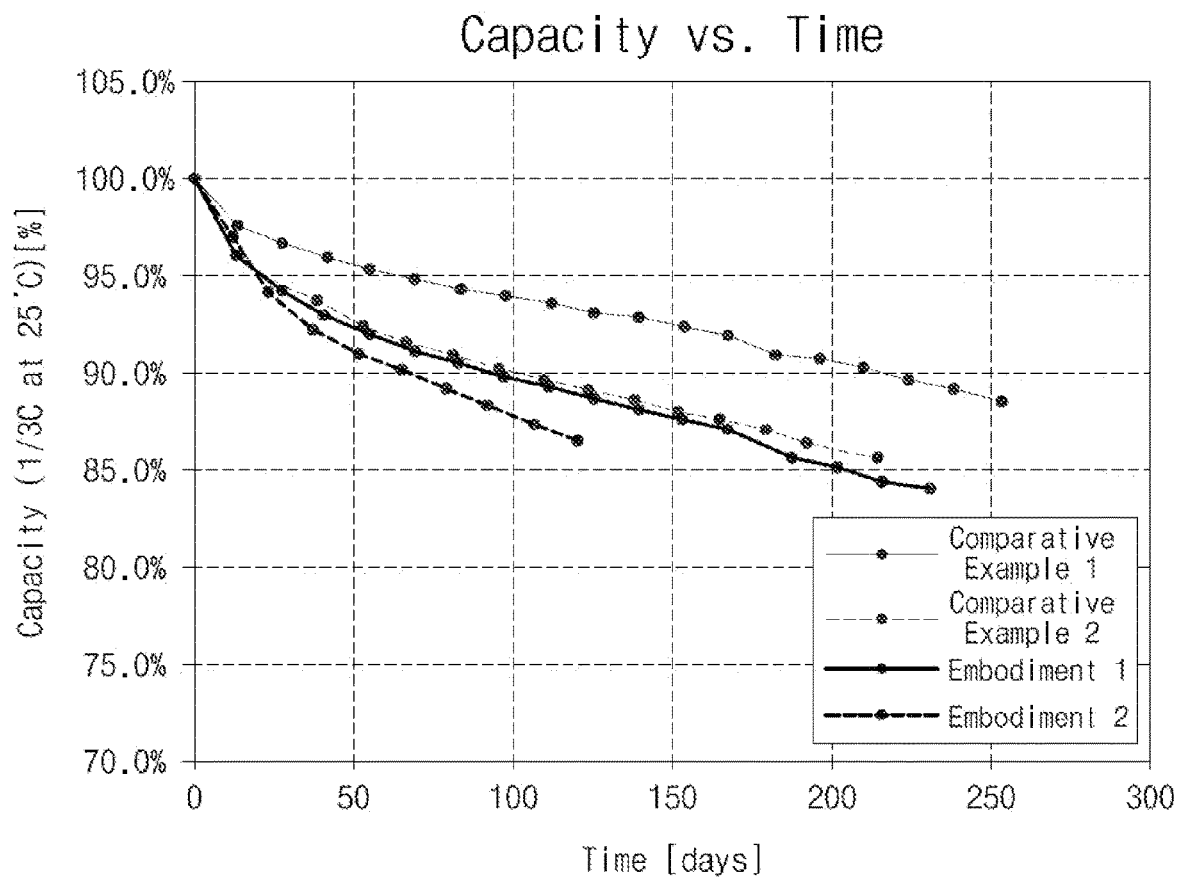
FIG. 3 is a table showing multiple life evaluation periods for multiple secondary batteries under life evaluation conditions.
FIG. 4A is a graph showing remaining life depending on the evaluation period of each secondary battery shown in FIG. 3.

FIG. 2 is a block diagram showing a method for evaluating a life according to example embodiments. FIG. 3 is a table showing multiple life evaluation periods for multiple secondary batteries under life evaluation conditions. FIG. 4A is a graph showing remaining life depending on the evaluation period of each secondary battery of FIG. 3.

In some embodiments, an X-axis (horizontal axis) may be an evaluation time (day) of the secondary battery, and a Y-axis (vertical axis) may be a remaining life (capacity (%) or SOH) of the secondary battery. In an implementation, the remaining life may be a value measured after charging the secondary battery to about ⅓ C at about 25° C. FIG. 4C illustrates a graph of direct current internal resistance (DC-IR) depending on SOH of each secondary battery of FIG. 3. In some embodiments, an X-axis (horizontal axis) may be SOH (%) of the secondary battery, and a Y-axis (vertical axis) may be DC-IR (%) of the secondary battery. In an implementation, the DC-IR may be a value measured for about 10 seconds if the SOC is about 50%.

A degradation mechanism of the lithium ion secondary battery may be largely explained by a cyclic effect and a storage effect. The cycle effect may mean a phenomenon in which impurities and oxygen are generated if lithium ions are intercalated into and deintercalated from a positive electrode plate and a negative electrode plate by repetitive charging and discharging of the battery, and as a result, impurities are precipitated on a separator, or the DC-IR of the lithium ion secondary battery increases due to an oxygen gas. In some embodiments, the storage effect may mean a phenomenon in which a film is formed by reduction decomposition of the negative electrode plate in the process of idling the battery for a long time, and the reduced material may be migrated to the positive electrode plate and adsorbed to the positive electrode plate to increase in electrical resistance. In the present disclosure, the life of the battery may be evaluated using the phenomenon in which the DC-IR increases due to a cyclic effect rather than a storage effect.

Referring to FIG. 2, a method for evaluating a life according to the present disclosure may include an evaluation condition input process (S11), a data computation process (S12), and an acceleration factor calculation process (S13).

In the evaluation condition input process (S11), a temperature, a charging rate, and a discharging rate for evaluating the accelerated idle life may be input. As illustrated in FIG. 3, Comparative Examples 1 and 2, and Embodiments 1 and 2 were prepared to confirm that the evaluation period may be reduced through the method for evaluating the accelerated life according to the present disclosure. The secondary batteries according to Comparative Examples 1 and 2 were set under the conditions depending on the typical method for evaluating the life, and in the secondary batteries according to Embodiments 1 and 2, the discharging rate was set to be changed depending on the method for evaluating the life according to the present disclosure.

In Comparative Example 1, a state of charge (SOC) swing of the secondary battery was set to about 0% to about 100%, an idle temperature was set to about 20° ° C. to about 30° C. (degrees Celsius) (preferably, about 25° C.), the charging rate was set to about 0.4 C to about 0.6 C (Coulombs) (preferably, about 0.5 C), and the discharge rate was set to about 0.1 C to about 0.3 C (preferably, about 0.2 C). Comparative Example 2 was set under the same condition as in Comparative Example 1, except the discharging rate of Comparative Example 1 may be changed for Comparative Example 2 to be from about 0.1 C to about 0.3 C (preferably, about 0.2 C) to about 0.4 C to about 0.6 C (preferably, about 0.5 C). Embodiment 1 was set under the same condition as in Comparative Example 1, except the discharging rate of Comparative Example 1 may be changed for Embodiment 1 to be from about 0.1 C to about 0.3 C (preferably, about 0.2 C) to about 0.5 C to about 1.5 C (preferably, about 1 C). Embodiment 2 was set under the same condition as in Comparative Example 1, except the discharging rate of Comparative Example 1 may be changed for Embodiment 2 to be from about 0.1 C to about 0.3 C (preferably, about 0.2 C) to about 1.5 C to about 2.5 C (preferably, about 2 C). In the evaluation condition input process (S11), the evaluation conditions (temperature, charging rate, and discharging rate) according to Comparative Example 1, Comparative Example 2, Embodiment 1, and Embodiment 2 may be input through the input unit 110.

In the data computation process (S12), the evaluation period until the state of health (SOH) of each secondary battery reaches about 80% to about 90%, preferably about 85%, may be measured in a state in which the evaluation conditions may be set as described above. Referring to FIGS. 3 and 4A, the evaluation period in which the SOH of the secondary battery according to Comparative Example 1 reached about 85% was about 295 days to about 305 days (e.g., about 300 days), and the evaluation period in which the SOH of the secondary battery according to Comparative Example 2 reached about 85% was about 226 days to about 234 days (e.g., about 230 days).

In some embodiments, the evaluation period in which the SOH of the secondary battery according to Embodiment 1 reached about 85% was about 188 days to about 202 days (e.g., about 200 days), and the evaluation period in which the SOH of the secondary battery according to Embodiment 2 reached about 85% was about 129 days to about 131 days (e.g., about 130 days).

In an implementation, it was confirmed that, if the discharging rate is set to about 1 C as in Embodiment 1, the evaluation period, in which the SOH of the secondary battery reaches about 85%, may be reduced by about 100 days compared to Comparative Example 1, and if the discharging rate is set to about 2 C as in Embodiment 2, the evaluation period, in which the SOH of the secondary battery reaches about 85%, may be reduced by about 170 days compared to Comparative Example 1.

In some embodiments, it may be seen that, in the method for evaluating the life according to the present disclosure, the accelerated life evaluation period may be reduced by increasing in discharge rate.

In some embodiments, in the past, the evaluation period of about 230 days to about 300 days was required to measure the remaining life (SOH) under conditions required by a customer (e.g., a company that manufactures electronic products equipped with the secondary battery). As described above, this may be a fatal weakness in information communication products having a very short development cycle. In order to overcome this limitation, according to the present disclosure, a device and method for evaluating the life under accelerated conditions have been developed. As described above, if the method for evaluating the life according to the present disclosure is used, the evaluation period may be reduced from about 300 days to about 130 days.

Figure 4B:
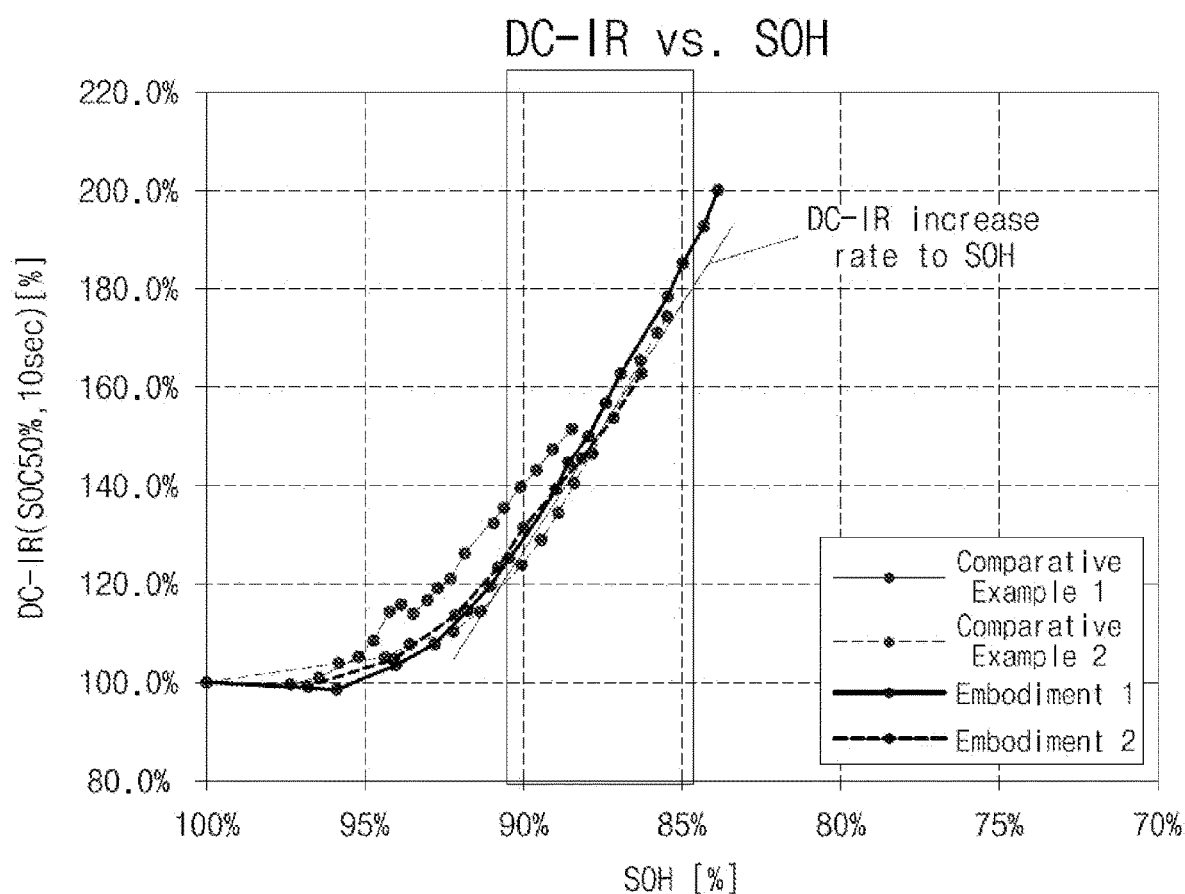
FIG. 4B is a graph showing a direct current internal resistance increase rate depending on the evaluation period of each secondary battery shown in FIG. 3.

FIG. 4B is a graph showing a direct current internal resistance increase rate depending on the evaluation period of each secondary battery of FIG. 3. As illustrated in FIG. 4B, a graph showing a correlation between the SOH and the DC-IR was obtained. In some embodiments, in the typical method and device for evaluating the life, it was seen that a ratio (inclination) of the DC-IR increase rate to the SOH of the secondary battery is substantially constant, even though the conditions for evaluating the life (or degradation conditions) are different. In some embodiments, in the art, it is recognized as a highly reliable acceleration evaluation method if an inclination angle of a straight line drawn between the X axis and the Y axis in FIG. 4B is about 30° to 80°. In some embodiments, it may be seen that the method for evaluating the accelerated life according to the present disclosure has excellent reliability.

In an implementation, the acceleration factor calculation process S13 shown in FIG. 2, an acceleration factor (A.F) may be calculated by the following equation, and in an implementation, the acceleration factor calculation part 122 shown in FIG. 1 may calculate the acceleration factor using the following equation:

$$\text{Acceleration factor}(A.F) = \text{DC-IR increase rate (\%)} / \text{Capacity degradation rate (\%)}$$

In some embodiments, as illustrated in FIG. 4C, if the SOH of the secondary battery according to Embodiment 1 may be changed from about 100% to about 85%, the DC-IR may be changed from about 100% to about 185%. In some embodiments, the capacity degradation rate of the secondary battery according to Embodiment 1 may be about 15%, the DC-IR increase rate may be about 85%, and the acceleration factor of the secondary battery according to Embodiment 1 may be about 5.67 (A.F=85/15=5.67).

In some embodiments, as illustrated in FIG. 4B, if the SOH of the secondary battery according to Embodiment 2 may be changed from about 100% to about 85%, the DC-IR may be changed from about 100% to about 180%. In some embodiments, the capacity degradation rate of the secondary battery according to Embodiment 2 may be about 15%, the DC-IR increase rate may be about 85%, and the acceleration factor of the secondary battery according to Embodiment 2 may be about 5.33 (A.F=80/15=4).

Based on these results, in the method of evaluating the life according to the present disclosure, the acceleration factor (A.F) may satisfy the following range. (3<A.F<8).

In some embodiment, if the acceleration factor (A.F) satisfies the above range, it may be determined that the reliability of the method for evaluating the accelerated life according to the present disclosure is within a reference range. In an implementation, if the acceleration factor is less than about 3 or greater than about 8, this may mean that the inclination angle of the straight line drawn between the capacity degradation rate (%) and the DC-IR increase rate (%) in FIG. 4B is out of about 30° to about 80°, and thus, the reliability of the method for evaluating the accelerated life may be low. As described above, if the reliability of the method for evaluating the accelerated life is low, the life evaluation result of the secondary battery evaluated according to the present disclosure may be distrusted in the market.

In some embodiments, the acceleration factor (A.F) in the method for evaluating the life according to the present disclosure may be about 4 to about 7, more preferably about 5 to about 6, and in this case, the reliability of the method for evaluating the accelerated life may be considered the best. In some embodiments, if the acceleration factor may be about 5 to about 6, the reliability of the accelerated idle life evaluation result according to the present disclosure may be highly evaluated in the market.

In the method and device for evaluating the life according to the embodiments of the present disclosure, life evaluation period may be reduced by fixing the evaluation temperature value and changing either the charging rate or the discharging rate (preferably, the discharging rate).

By way of summation and review, performance and life tests are essential for performance evaluation, improvement, and development of new products for market entry, but the life tests of the secondary batteries require a long time in proportion to the product life, making it difficult to obtain results in a relatively short period of time.

The above-described information disclosed in the technology that serves as the background of the present disclosure is only for improving understanding of the background of the present disclosure and thus may include information that does not constitute the related art.

Aspects of some embodiments of the present disclosure provide a device and method for evaluating a life of a secondary battery, which are capable of reducing an evaluation period for a life test of the secondary battery.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for evaluating a life of a secondary battery, comprising:
    an evaluation condition input process of inputting a temperature, a charging rate, and a discharging rate to evaluate the life of the secondary battery;
    a data computation process of computing an evaluation period, in which a state of health of the secondary battery reaches a set range, a capacity degradation rate, and a direct current internal resistance change rate; and
    an acceleration factor calculation process of calculating an acceleration factor of the secondary battery using a first equation,
    the first equation being that the acceleration factor is equal to a direct current internal resistance increase rate divided by the capacity degradation rate.

2. The method as claimed in claim 1, wherein in the data computation process, the set range of the state of health of the secondary battery is about 80% to about 90%.

3. The method as claimed in claim 1, wherein in the acceleration factor calculation process, the acceleration factor is about 3 to about 8.

4. The method as claimed in claim 1, wherein in the evaluation condition input process, the temperature is input as a constant value, and at least one of a charge rate or a discharge rate is input as a variable value.

5. The method as claimed in claim 1, wherein in the evaluation condition input process, the temperature and the charging rate are input as constant values, and a discharge rate is input as a variable value.

6. The method as claimed in claim 5, wherein in the evaluation condition input process, the discharge rate is input at a value higher than that of the charging rate.

7. A device for evaluating a life of a secondary battery, comprising:
- an input unit receiving a temperature, a charging rate, and a discharging rate to evaluate the life of the secondary battery;
- a data computation unit computing an evaluation period, in which a state of health of the secondary battery reaches a set range, a capacity degradation rate, and a direct current internal resistance change rate; and
- an acceleration factor calculation unit calculating an acceleration factor of the secondary battery using a first equation,
- the first equation being that the acceleration factor is equal to a direct current internal resistance increase rate divided by the capacity degradation rate.

8. The device as claimed in claim 7, wherein in the data computation unit, the set range of the state of health of the secondary battery is about 80% to about 90%.

9. The device as claimed in claim 7, wherein in the acceleration factor calculation unit, the acceleration factor is about 3 to about 8.

10. The device as claimed in claim 7, wherein in the evaluation condition input unit, the temperature is input as a constant value, and at least one of a charge rate or a discharge rate is input as a variable value.

11. The device as claimed in claim 7, wherein in the evaluation condition input unit, the temperature and the charging rate are input as constant values, and a discharge rate is input as a variable value.

12. The device as claimed in claim 11, wherein in the evaluation condition input unit, the discharge rate is input at a value higher than that of the charging rate.

13. A method for evaluating a life of a secondary battery, comprising:
- an evaluation condition input process of inputting a temperature, a charging rate, and a discharging rate to evaluate the life of the secondary battery;
- a data computation process of computing an evaluation period, in which a state of health of the secondary battery reaches a set range, a capacity degradation rate, and a direct current internal resistance change rate; and
- an acceleration factor calculation process of calculating an acceleration factor of the secondary battery using a first equation.

14. The method as claimed in claim 13, wherein in the data computation process, the set range of the state of health of the secondary battery is about 80% to about 90%.

15. The method as claimed in claim 13, wherein in the acceleration factor calculation process, the acceleration factor is about 3 to about 8.

16. The method as claimed in claim 13, wherein in the evaluation condition input process, the temperature is input as a constant value, and at least one of a charge rate or a discharge rate is input as a variable value.

17. The method as claimed in claim 13, wherein in the evaluation condition input process, the temperature and the charging rate are input as constant values, and a discharge rate is input as a variable value.

18. The method as claimed in claim 17, wherein in the evaluation condition input process, the discharge rate is input at a value higher than that of the charging rate.

19. The method as claimed in claim 16, wherein the discharge rate is about 0.5 C to about 2.5 C.

20. The method as claimed in claim 13, wherein the first equation is that the acceleration factor is equal to a direct current internal resistance increase rate divided by the capacity degradation rate.

* * * * *